(12) United States Patent
Moon et al.

(10) Patent No.: US 7,639,547 B2
(45) Date of Patent: Dec. 29, 2009

(54) SEMICONDUCTOR MEMORY DEVICE FOR INDEPENDENTLY CONTROLLING INTERNAL SUPPLY VOLTAGES AND METHOD OF USING THE SAME

(75) Inventors: Jang-won Moon, Anyang-si (KR);
Young-hyun Jun, Seoul (KR);
Jong-hyoung Lim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 173 days.

(21) Appl. No.: 11/888,468

(22) Filed: Aug. 1, 2007

(65) Prior Publication Data
US 2008/0159044 A1 Jul. 3, 2008

(30) Foreign Application Priority Data
Dec. 27, 2006 (KR) .................. 10-2006-0135031

(51) Int. Cl.
*G11C 7/00* (2006.01)
(52) U.S. Cl. .................. 365/189.09; 365/189.07; 365/201
(58) Field of Classification Search ............ 365/189.07, 365/189.09, 201
See application file for complete search history.

(56) References Cited

U.S. PATENT DOCUMENTS

| 6,087,891 | A | 7/2000 | Yoon et al. |
| 6,424,134 | B2 * | 7/2002 | Morishita et al. ........... 323/313 |
| 6,498,469 | B2 * | 12/2002 | Kobayashi .................. 323/313 |
| 6,552,578 | B1 | 4/2003 | Cheung et al. |
| 6,600,692 | B2 | 7/2003 | Tanzawa |
| 7,382,677 | B2 * | 6/2008 | Lee et al. ..................... 365/226 |

FOREIGN PATENT DOCUMENTS

| JP | 2002-258955 | 9/2002 |
| JP | 2003-338548 | 11/2003 |
| KR | 2001-0059032 | 7/2001 |

* cited by examiner

*Primary Examiner*—Hoai V Ho
(74) *Attorney, Agent, or Firm*—Miles & Onello, LLP (57) ABSTRACT

Provided is a semiconductor memory device and method that can control internal supply voltages independently. The semiconductor memory device includes a memory cell array, a reference voltage generating unit, an internal reference voltage generating unit, and an internal supply voltage generating unit. The reference voltage generating unit outputs a reference voltage in response to an external voltage. The internal reference voltage generating unit converts the reference voltage into a plurality of internal reference voltages, and outputs the plurality of internal reference voltages. The internal supply voltage generating unit converts the plurality of internal reference voltages into a plurality of internal supply voltages, and outputs the plurality of internal supply voltages. A first internal reference voltage is used to generate a first internal supply voltage and a second internal reference voltage is used to generate a second internal supply voltage.

30 Claims, 4 Drawing Sheets

SEMICONDUCTOR MEMORY DEVICE FOR INDEPENDENTLY CONTROLLING INTERNAL SUPPLY VOLTAGES AND METHOD OF USING THE SAME

CROSS-REFERENCE TO RELATED PATENT APPLICATION

This application claims priority under 35 U.S.C. 119 to Korean Patent Application No. 10-2006-0135031, filed on Dec. 27, 2006, in the Korean Intellectual Property Office, the disclosure of which is incorporated herein in its entirety by reference.

BACKGROUND OF THE INVENTION

1. Field of the Invention

The present invention relates to internal supply voltage generation, and more particularly, to a semiconductor memory device for independently controlling internal supply voltages, and a method of using the same.

2. Description of the Related Art

As semiconductor memory devices have become faster and more highly integrated, an internal supply voltage generating circuit has been employed to reduce an operating current. That is, an internal supply voltage generating circuit receives an internal reference voltage, and generates an internal supply voltage from an external voltage. An exemplary supply voltage generating circuit for generating internal supply voltages is disclosed in U.S. Pat. No. 6,087,891.

An internal boosting voltage is obtained by boosting an internal supply voltage provided from the internal supply voltage generating circuit. For example, in Dynamic Random Access Memories (DRAMs), the internal boosting voltage is used to ensure a stable word line voltage. Also, the internal boosting voltage is used in split gate circuits which separate a cell array from a sense amplifier circuit, row driver circuits of DRAM or SRAM, or clock driver circuits, etc.

In conventional technologies, the internal boosting voltage and the internal supply voltage (that is, an array voltage) which is supplied to the memory cell array depend on the internal reference voltage. That is, as the internal reference voltage increases or decreases, the internal boosting voltage and the array voltage are also increased or decreased. Also, since the internal boosting voltage is controlled by a predetermined gain in an internal boosting voltage generating unit, it is difficult to independently control the internal boosting voltage and the array voltage. That is, according to conventional technologies, it is impossible to independently control the internal boosting voltage and an array voltage.

SUMMARY OF THE INVENTION

The present invention provides a semiconductor memory device that can independently control internal supply voltages. The present invention also provides a method using the semiconductor memory device.

According to an aspect of the present invention, there is provided a semiconductor memory device including a memory cell array, the semiconductor memory device including: a reference voltage generating unit configured to output a reference voltage in response to an external voltage; an internal reference voltage generating unit configured to convert the reference voltage into a plurality of internal reference voltages, and to output the plurality of internal reference voltages; and an internal supply voltage generating unit configured to convert the plurality of internal reference voltages into a plurality of internal supply voltages, and to output the plurality of internal reference voltages, wherein a first internal reference voltage of the plurality of internal reference voltages is used to generate a first internal supply voltage of the plurality of internal supply voltages, and a second internal reference voltage of the plurality of internal reference voltages is used to generate a second internal supply voltage of the plurality of internal supply voltages.

The internal reference voltage generating unit can include: a first internal reference voltage generator configured to convert the reference voltage into the first internal reference voltage, and configured to output the first internal reference voltage; and a second internal reference voltage generator configured to convert the reference voltage into the second internal reference voltage, and to output the second internal reference voltage, wherein the internal reference voltage generating unit is configured to independently vary the first internal reference voltage and the second internal reference voltage based on the reference voltage.

Each of the first internal reference voltage generator and the second internal reference voltage generator can include: a comparison voltage generating circuit configured to generate and output a comparison voltage using a corresponding internal reference voltage; a comparison circuit configured to compare the comparison voltage with the reference voltage and to output the result of the comparison as an output signal; and an internal reference voltage control circuit configured to control the corresponding internal reference voltage in response to the output signal of the comparison circuit.

The comparison voltage generating circuit can include: a plurality of resistors configured to divide the corresponding internal reference voltage; and at least one fuse configured to cause at least one resistor of the plurality of resistors to be connected or disconnected.

The at least one fuse can be cut-off or not cut-off in response to a test Mode Register Set (MRS) signal.

The comparison voltage generating circuit can include: a plurality of resistors configured to divide the corresponding internal reference voltage; and at least one transistor configured to cause at least one resistor of the plurality of resistors to be connected or disconnected.

The transistor can be turned on or off in response to a test Mode Register Set (MRS) signal.

The internal reference voltage control circuit can be a transistor having a gate connected to an output terminal of the comparison circuit, a first terminal connected to the external voltage, and a second terminal connected to an output terminal of the internal reference voltage generator and the comparison voltage generating circuit.

The comparison circuit can be a comparator configured to compare the reference voltage with the comparison voltage, and to output the result of the comparison.

The internal supply voltage generating unit can include: a first internal supply voltage generator configured to convert the first internal reference voltage into the first internal supply voltage, and to output the first internal supply voltage; and a second internal supply voltage generator configured to convert the second internal reference voltage into the second internal supply voltage, and to output the second internal supply voltage.

Each of the first internal supply voltage generator and the second internal supply voltage generator can include: a comparing circuit configured to compare the reference voltage with a corresponding internal supply voltage, and to output the result of the comparison as an output signal; and an internal supply voltage control circuit configured to control the corresponding internal supply voltage according to the output signal of the comparison circuit.

The internal supply voltage control circuit can be a transistor having a gate connected to an output terminal of the comparison circuit, a first terminal connected to the external voltage, and a second terminal connected to an output terminal of the internal supply voltage generator and an input terminal of the comparison circuit.

The comparison circuit can be a comparator configured to compare the reference voltage with the comparison voltage, and to output the result of the comparison.

The reference voltage generating unit can comprise a plurality of resistors configured to divide the external voltage and to generate the reference voltage.

The semiconductor memory device can further include an internal boosting voltage generating unit configured to convert the second internal supply voltage into an internal boosting voltage, and to output the internal boosting voltage.

The first internal supply voltage can be an array voltage which is supplied to the memory cell array.

According to another aspect of the present invention, there is provided an internal supply voltage generating method including: outputting a reference voltage in response to an external voltage; converting the reference voltage into a plurality of internal reference voltages, and outputting the plurality of internal reference voltages; and converting the plurality of internal reference voltages into a plurality of internal supply voltages, and outputting the plurality of internal supply voltages, wherein a first internal reference voltage of the plurality of internal reference voltages is used to generate a first internal supply voltage of the plurality of internal supply voltages, and a second internal reference voltage of the plurality of internal reference voltages is used to generate a second internal supply voltage of the plurality of internal supply voltages.

Generating of the plurality of internal reference voltages can comprise: generating and outputting a comparison voltage using a corresponding internal reference voltage; comparing the reference voltage with the comparison voltage; and controlling and outputting the corresponding internal reference voltage in response to the result of the comparison.

Generating and outputting of the comparison voltage can comprise dividing the corresponding internal reference voltage using a plurality of resistors, and outputting the result of the dividing as the comparison voltage.

Generating and outputting of the comparison voltage can further comprise changing the resistance of at least one resistor of the plurality of resistors by cutting-off or not cutting-off at least one fuse causing at least one resistor of the plurality of resistors to be connected or disconnected.

Generating and outputting of the comparison voltage can further comprise changing the resistance of the at least one resistor of the plurality of resistors by turning on or off at least one transistor causing at least one resistor of the plurality of resistors to be connected or disconnected.

Outputting of the plurality of internal supply voltages can comprise: comparing the reference voltage with a corresponding internal supply voltage; and controlling and outputting the corresponding internal supply voltage in response to the result of the comparison.

Outputting the reference voltage can comprise dividing the external voltage using the plurality of resistors, and outputting the result of the dividing as the reference voltage.

The method can further comprise converting the second internal supply voltage of the plurality of internal supply voltages into an internal boosting voltage.

The method can further comprise supplying the first internal supply voltage of the plurality of internal supply voltages to a memory cell array.

According to yet another aspect of the present invention, there is provided a semiconductor memory device including a memory cell array, the semiconductor memory device including: a reference voltage generating unit configured to output a reference voltage in response to an external voltage; an internal reference voltage generating unit configured to convert the reference voltage into at least one internal reference voltage, and to output the at least one internal reference voltage; and an internal supply voltage generating unit configured to convert the internal reference voltage into a plurality of internal supply voltages, and to output the plurality of internal supply voltages, wherein the internal reference voltage generating unit is configured to generate a common internal reference voltage which is used to generate the plurality of internal supply voltages, or to generate a plurality of internal reference voltages which are used to generate the plurality of internal supply voltages, in response to a test Mode Register Set (MRS) signal.

When the test MRS signal is disabled, the internal reference voltage generating unit is configured to generate the common internal reference voltage which is used to generate the plurality of internal supply voltages, and when the test MRS signal is enabled, the internal reference voltage generating unit is configured to generate the plurality of internal reference voltages which are used to generate the plurality of internal supply voltages.

The internal reference voltage generating unit can comprise: a first internal reference voltage generator configured to convert the reference voltage into a first internal reference voltage of the plurality of internal reference voltages, and to output the first internal reference voltage; and a second internal reference voltage generator configured to convert the reference voltage into a second internal reference voltage of the plurality of internal reference voltages, and to output the second internal reference voltage, wherein the first internal reference voltage generator and the second internal reference voltage generator are respectively configured to generate the first internal reference voltage and the second internal reference voltage, when the test MRS signal is enabled.

According to yet another aspect of the present invention, there is provided an internal supply voltage generating method including: outputting a reference voltage in response to an external voltage; converting the reference voltage into at least one internal reference voltage, and outputting the at least one internal reference voltage; and converting the internal reference voltage into a plurality of internal supply voltages, and outputting the plurality of internal supply voltages, wherein the outputting of the at least one internal reference voltage comprises generating a common internal reference voltage which is used to generate the plurality of internal supply voltages, or generating a plurality of internal reference voltages which are used to generate the plurality of internal supply voltages, in response to a test Mode Register Set (MRS) signal.

The outputting of the at least one internal reference voltage can include: when the test MRS signal is disabled, generating the common internal reference voltage which is used to generate the plurality of internal supply voltages; and when the test MRS signal is enabled, generating the plurality of internal reference voltages which are used to generate the plurality of internal supply voltages.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF THE INVENTION

Hereinafter, aspects of the present invention will be described in detail by explaining preferred embodiments in accordance therewith, with reference to the attached drawings. Like reference numerals in the drawings denote like elements.

It will be understood that, although the terms first, second, etc. may be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements may be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Figure 1:
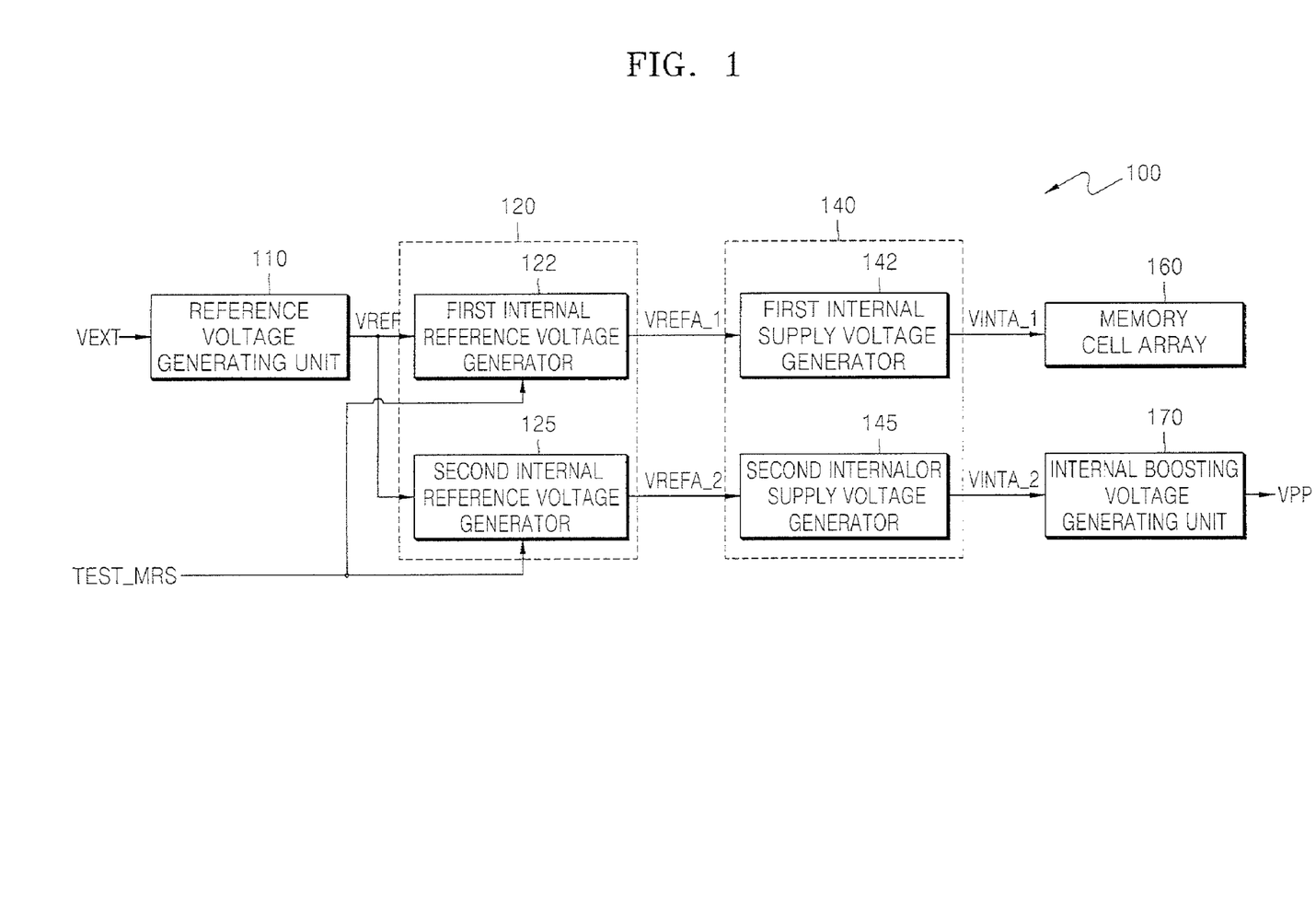
FIG. 1 is a block diagram of an embodiment of a semiconductor memory device according to aspects of the present invention.

FIG. 1 is a block diagram of an embodiment of a semiconductor memory device 100 according to an aspect of the present invention.

Referring to FIG. 1, the semiconductor memory device 100 includes a reference voltage generating unit 110, an internal reference voltage generating unit 120, an internal supply voltage generating unit 140, a memory cell array 160, and an internal boosting voltage generating unit 170.

The reference voltage generating unit 110 outputs a reference voltage VREF in response to an external voltage VEXT. The internal reference voltage generating unit 120 converts the reference voltage VREF into a plurality of internal reference voltages VREFA_1 and VREFA_2. The internal reference voltage generating unit 120 includes a plurality of internal reference voltage generators. For convenience of description, in FIG. 1, the internal reference voltage generating unit 120 includes a first reference voltage generator 122 and a second reference voltage generator 125. The same effect can be obtained if the internal reference voltage generating unit 120 further includes additional reference voltage generators, which additionally, and respectively, output independent internal reference voltages.

The first internal reference voltage generator 122 converts the reference voltage VREF into a first internal reference voltage VREFA_1 and outputs the first internal reference voltage VREFA_1. Also, the second internal reference voltage generator 125 converts the reference voltage VREF into a second internal reference voltage VREFA_2 and outputs, the second internal reference voltage VREFA_2. That is, the internal reference voltage generating unit 120 receives the reference voltage VREF, and independently generates each of the first and second internal reference voltages through each of the first and second internal reference voltage generators 122 and 125.

The internal supply voltage generating unit 140 converts the first and second internal reference voltages VREFA_1 and VREFA_2 into a plurality of internal supply voltages VINTA_1 and VINTA_2, and outputs the plurality of internal supply voltages VINTA_1 and VINTA_2. The internal supply voltage generating unit 140 includes a plurality of internal supply voltage generators 142 and 145. In FIG. 1, for convenience of description, the internal supply voltage generating unit 140 includes a first internal supply voltage generator 142 and a second internal supply voltage generator 145. If the internal reference voltage generating unit 140 includes additional internal reference voltage generators, by including additional internal supply voltage generators to respectively output additional internal supply voltages, the same effect can be obtained.

The first internal supply voltage generator 142 converts the first internal reference voltage VREFA_1 into a first internal supply voltage VINTA_1 and outputs the first internal supply voltage VINTA_1. Also, the second internal supply voltage generator 145 converts the second internal reference voltage VREFA_2 into a second internal supply voltage VINTA_2, and outputs the second internal supply voltage VINTA_2. That is, the first internal supply voltage VINTA_1 is generated according to the first internal reference voltage VREFA_1, and the second internal supply voltage VINTA_2 is generated according to the second internal reference voltage VREFA_2.

The first internal supply voltage VINTA_1 is supplied to the memory cell array 160. That is, the first internal supply voltage VINTA_1 is an array voltage that is to be applied to the memory cell array 160. Also, the second internal supply voltage VINTA_2 is converted into an internal boosting voltage VPP through the internal boosting voltage generating unit 170. That is, the internal boosting voltage generating unit 170 converts the second internal supply voltage VINTA_2 into an internal boosting voltage VPP, and outputs the internal boosting voltage VPP.

The reference voltage generating unit 110 can divide the external voltage VEXT using a plurality of resistors, and generates the reference voltage VREF. The reference voltage generating unit 110, the memory cell array 160, and the internal boosting voltage generating unit 170 are well-known to those skilled in the art, and accordingly a detailed circuit diagram thereof will be omitted.

Hereinafter, the internal reference voltage generating unit 120 and the internal supply voltage generating unit 140 will be described.

Figure 2A:
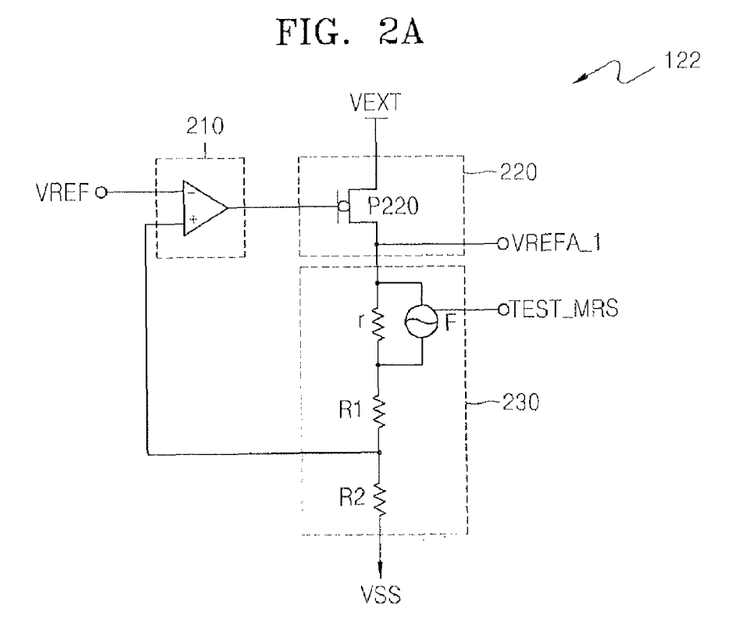
FIGS. 2A and 2B are circuit diagrams of an embodiment of a first internal reference voltage generator illustrated in FIG. 1 according to aspects of the present invention.

FIG. 2A is a circuit diagram of an embodiment of the first internal reference voltage generator 122 illustrated in FIG. 1 according to an aspect of the present invention.

The second internal reference voltage generator 125 has the same construction as the first internal reference voltage generator 122. Accordingly, hereinafter, only the first internal reference voltage generator 122 will be described. Referring to FIG. 2A, the first internal reference voltage generator 122 includes a comparison circuit 210, an internal reference voltage control circuit 220, and a comparison voltage generating circuit 230. The comparison circuit 210 compares the reference voltage VREF with a comparison voltage output from the comparison voltage generating circuit 230, and outputs the result of the comparison as an output signal. The internal reference voltage control circuit 220 controls the first internal reference voltage VREFA_1 in response to the output signal of the comparison circuit 210. The comparison voltage generating circuit 230 generates and outputs the comparison voltage using the first internal reference voltage VREFA_1.

The comparison voltage generating circuit 230 includes a plurality of resistors R1, R2, and r, and at least one fuse F. That is, the comparison voltage generating circuit 230 divides the first internal reference voltage VREFA_1 using the plurality of resistors R1, R2, and r. The fuse F is connected in parallel to the resistor r of the plurality of resistors R1, R2, and r. The first internal reference voltage VREFA_1 is divided into different ratios according to whether or not the fuse F is cut-off. For example, in the case of FIG. 2A, if the fuse F is not cut-off, the first internal reference voltage VREFA_1 is divided into the ratio of R1:R2. However, if the fuse F is cut-off, the first internal reference voltage VREFA_2 is divided into the ratio of (R1+r):R2. For convenience of description, FIG. 2A illustrates the case where a single fuse F is connected to a single resistor r. It will be understood by those skilled in the art that the comparison voltage can be finely adjusted using a plurality of resistors and fuses having a structure substantially similar to that described above. The fuse F can be set to be cut-off or not to be cut-off in response to a Test Mode Register Set signal TEST_MRS illustrated in FIG. 1.

The comparison circuit 210 can be a comparator configured to compare the reference voltage VREF with the comparison voltage output from the comparison voltage generating circuit 230. The internal reference voltage control circuit 220 can be a PMOS transistor P220. In this embodiment, the gate of the PMOS transistor P220 is connected with the output terminal of the comparison circuit 210, the first terminal of the PMOS transistor P220 is connected to the external voltage VEXT, and the second terminal of the PMOS transistor P220 is connected to the output terminal of the internal reference voltage generator 122 and the comparison voltage generating unit 230.

Figure 2B:
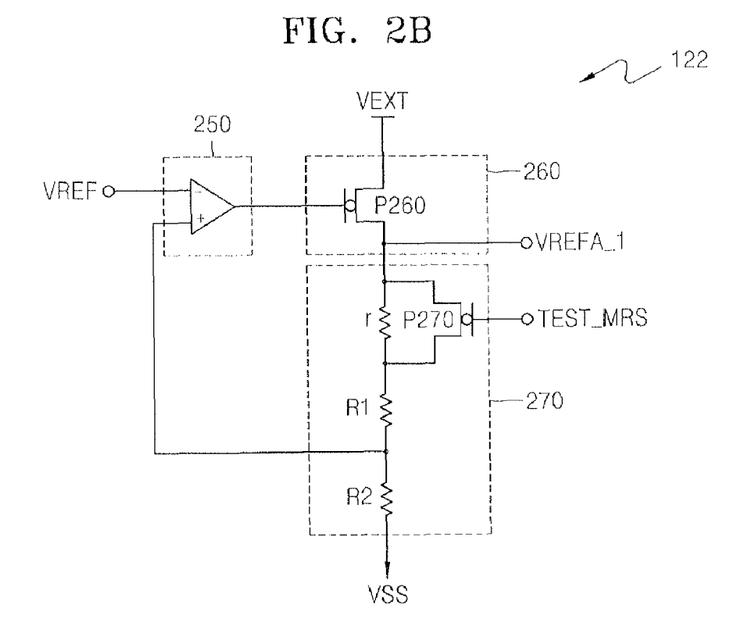

FIG. 2B is a circuit diagram of an embodiment of the first internal reference voltage generator 122 illustrated in FIG. 1 according to another aspect of the present invention.

Like FIG. 2A, hereinafter, the first internal reference voltage generator 122 will be described. Referring to FIG. 2B, the first internal reference voltage generator 122 includes a comparison circuit 250, an internal reference voltage control circuit 260, and a comparison voltage generating circuit 270. In this embodiment the comparison circuit 250 and the internal reference voltage control circuit 260 have the same constructions as those illustrated in FIG. 2A and performs the same functions, so a detailed description thereof will be omitted.

The comparison voltage generating circuit 270 includes a plurality of resistors R1, R2, and r, and at least one transistor P270. That is, like FIG. 2A, the comparison voltage generating circuit 270 divides the first internal reference voltage VREFA_1 using the plurality of resistors R1, R2, and r. The resistor r of the plurality of resistors R1, R2, and r is connected in parallel to the transistor P270, instead of the fuse F illustrated in FIG. 2A. The first internal reference voltage VREFA_1 is divided into different ratios according to whether the transistor P270 is turned on or off. For example, in the case of FIG. 2B, when the transistor P270 is turned on, the first internal reference voltage VREFA_1 is divided into the ratio of R1:R2. However, when the transistor P270 is turned off, the first internal reference voltage VREFA_1 is divided into the ratio of (R1+r):R2. FIG. 2B illustrates the case where a single resistor r is connected to a single transistor P270. It will be understood by one of ordinary skill in the art that the comparison voltage can be finely adjusted using a plurality of resistors and transistors. The transistor P270 can be set to be turned on or off in response to a Test Mode Register Set signal TEST_MRS. Also, the transistor P270 can be a PMOS transistor. Alternatively, the transistor P270 can be a NMOS transistor.

Figure 3:
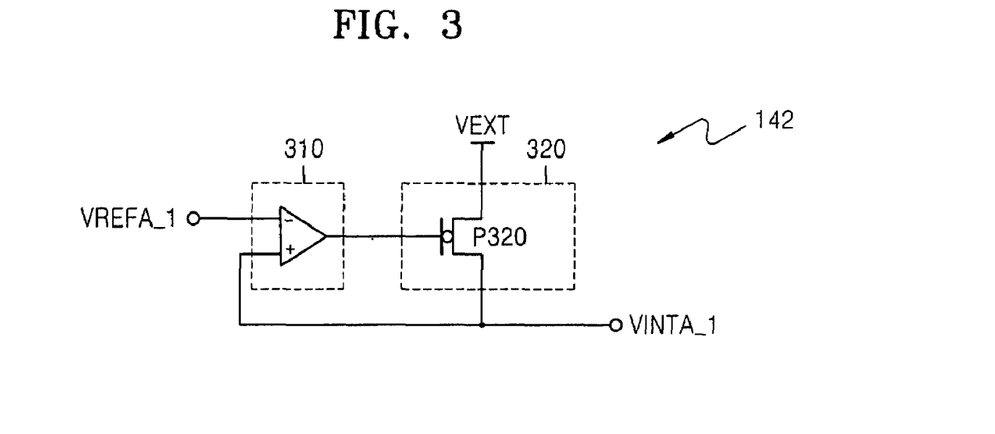
FIG. 3 is a circuit diagram of an embodiment of a first internal supply voltage generator illustrated in FIG. 1.

FIG. 3 is a circuit diagram of an embodiment of the first internal supply voltage generator 142 illustrated in FIG. 1.

The second internal supply voltage generator 145 has the same construction as the first internal supply voltage generator 142. Accordingly, hereinafter, only the first internal supply voltage generator 142 will be described. Referring to FIG. 3, the first internal supply voltage generator 142 includes a comparison circuit 310 and an internal supply voltage control circuit 320. The comparison circuit 310 compares the first internal reference voltage VREFA_1 with the first internal supply voltage VINTA_1, and outputs the result of the comparison as an output signal. The internal supply voltage control circuit 320 controls the first internal supply voltage VINTA_1 in response to the output signal of the comparison circuit 310.

The comparison circuit 310 can be a comparator for comparing the first internal reference voltage VREFA_1 with the first internal supply voltage VINTA_1. The internal supply voltage control circuit 320 can be a PMOS transistor P320. The gate of the PMOS transistor P320 is connected to the output terminal of the comparison circuit 310, the first terminal of the PMOS transistor P320 is connected to the external voltage VEXT, and the second terminal of the internal supply voltage generator 142 is connected to the output terminal of the internal supply voltage generator 142 and the input terminal of the comparison circuit 310.

Figure 4:
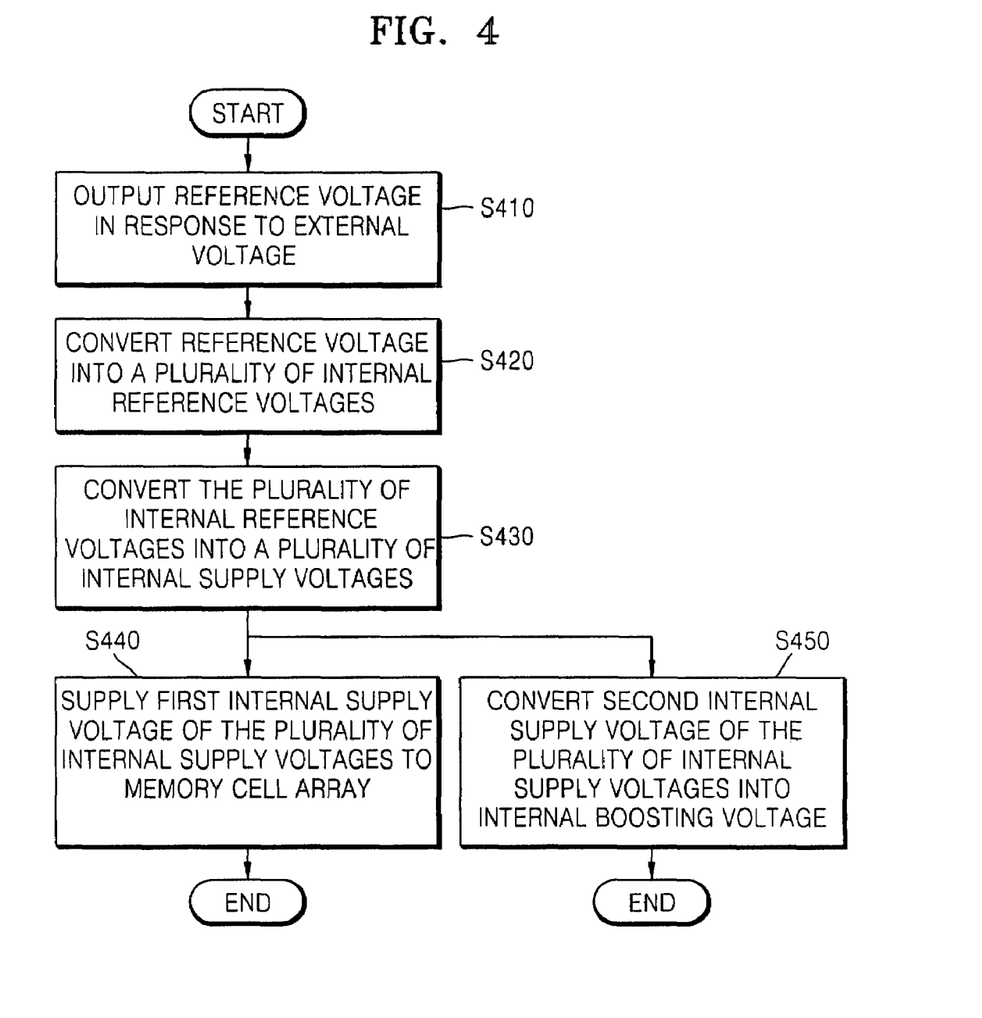
FIG. 4 is a flowchart of an embodiment of an internal supply voltage generating method according to an aspect of the present invention.

FIG. 4 is a flowchart of an embodiment of an internal supply voltage generating method according to an aspect of the present invention.

Referring to FIGS. 1 and 4, the reference voltage generating unit 110 outputs a reference voltage VREF in response to an external voltage VEXT (operation S410). The reference voltage generating unit 110 divides the external voltage VEXT using a plurality of resistors, and generates the reference voltage VREF. The internal reference voltage generating unit 120 converts the reference voltage VREF into first and second internal reference voltages VREFA_1 and VREFA_2 (operation S420). That is, the first internal reference voltage generator 122 converts the reference voltage VREF into the first internal reference voltage VREFA_1, and outputs the first internal reference voltage VREFA_1. The second internal reference voltage generator 125 converts the reference voltage VREF into the second internal reference voltage VREFA_2, and outputs the second internal reference voltage VREFA_2. The first internal reference voltage generator 122 and the second internal reference voltage generator 125 can be controlled by a test MRS signal. The internal supply voltage generator 140 converts the first and second internal reference voltages VREFA_1 and VREFA_2 into first and second internal supply voltages VINTA_1 and VINTA_2, and outputs the first and second internal supply voltages VINTA_1 and VINTA_2 (operation S430). That is, the first internal supply voltage generator 142 converts the first internal reference voltage VREFA_1 into the first internal supply voltage VINTA_1, and outputs the first internal supply voltage VINTA_1. Also, the second internal supply voltage generator 145 converts the first internal reference voltage VREFA_2 into the second internal supply voltage VINTA_2, and outputs the second internal supply voltage VINTA_2. The first internal supply voltage VINTA_1 is supplied to the memory cell array 160 (operation S440). That is, the first internal supply voltage VINTA_1 is an array voltage that is to be supplied to the memory cell array 160. Also, the second internal supply voltage VINTA_2 is transferred to the internal boosting voltage generator 170, and the internal boosting voltage generator 170 converts the second internal supply voltage VINTA_2 into an internal boosting voltage VPP and outputs the internal boosting voltage VPP (operation S450).

Figure 5:
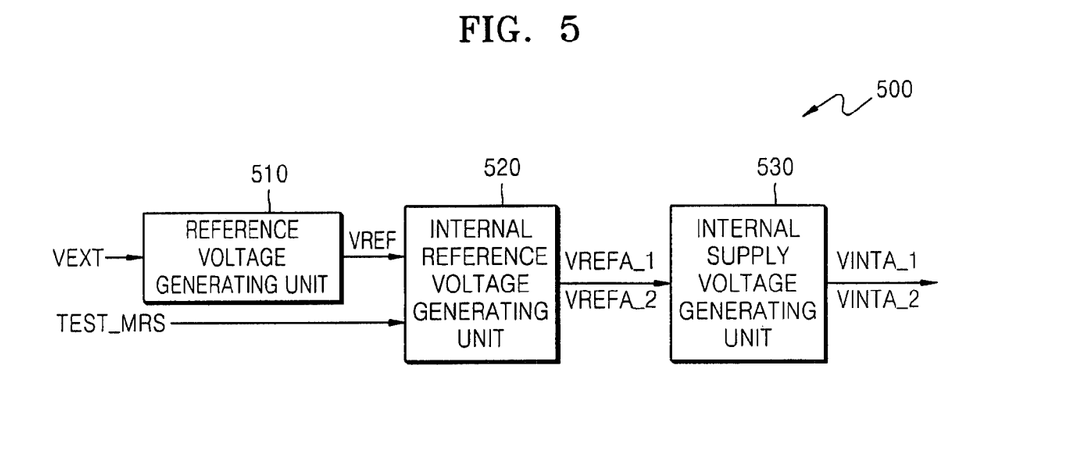
FIG. 5 is a block diagram of another embodiment of a semiconductor memory device according to aspects of the present invention.

FIG. 5 is a block diagram of an embodiment of a semiconductor memory device 500 according to another aspect of the present invention.

Referring to FIG. 5, the semiconductor memory device 500 includes a reference voltage generating unit 510, an internal reference voltage generating unit 520, and an internal supply voltage generating unit 530. Since, in this embodiment, the reference voltage generating unit 510 and the internal supply voltage generating unit 530 operate in the same way as the reference voltage generating unit 110 and the internal supply voltage generating unit 130 illustrated in FIG. 1, a detailed description thereof will be omitted.

The internal reference voltage generating unit 520 generates a common internal reference voltage VREFA_1, or first and second reference voltages VREFA_1 and VREFA_2, in response to a test MRS signal. If the test MRS signal is disabled, the internal reference voltage generating unit 520 outputs only the common internal reference voltage VREFA_1. The first and second internal supply voltages VINTA_1 and VINTA_2 are varied based on the common internal reference voltage VREFA_1. If the test MRS signal is enabled, the internal reference voltage generating unit 520 outputs the first and second internal reference voltages VREFA_1 and VREFA_2. Each of the first and second internal supply voltages VINTA_1 and VINTA_2 are varied based on each of the first and second internal supply voltages VREFA_1 and VREFA_2. That is, the semiconductor memory device 500 can operate like a conventional device or like the semiconductor memory device 100 illustrated in FIG. 1, according to whether the test MRS signal is enabled or not.

The internal reference voltage generating unit 520 can include a first internal reference voltage generator which converts a reference voltage VREF into a first internal reference voltage VREF_1, and a second internal reference voltage generator which converts the reference voltage VREF into a second internal reference voltage VREF_2. The first internal reference voltage generator and the second internal reference voltage generator respectively output the first internal reference voltage VREFA_1 and the second internal reference voltage VREF_2 when the test MRS signal is enabled.

Figure 6:
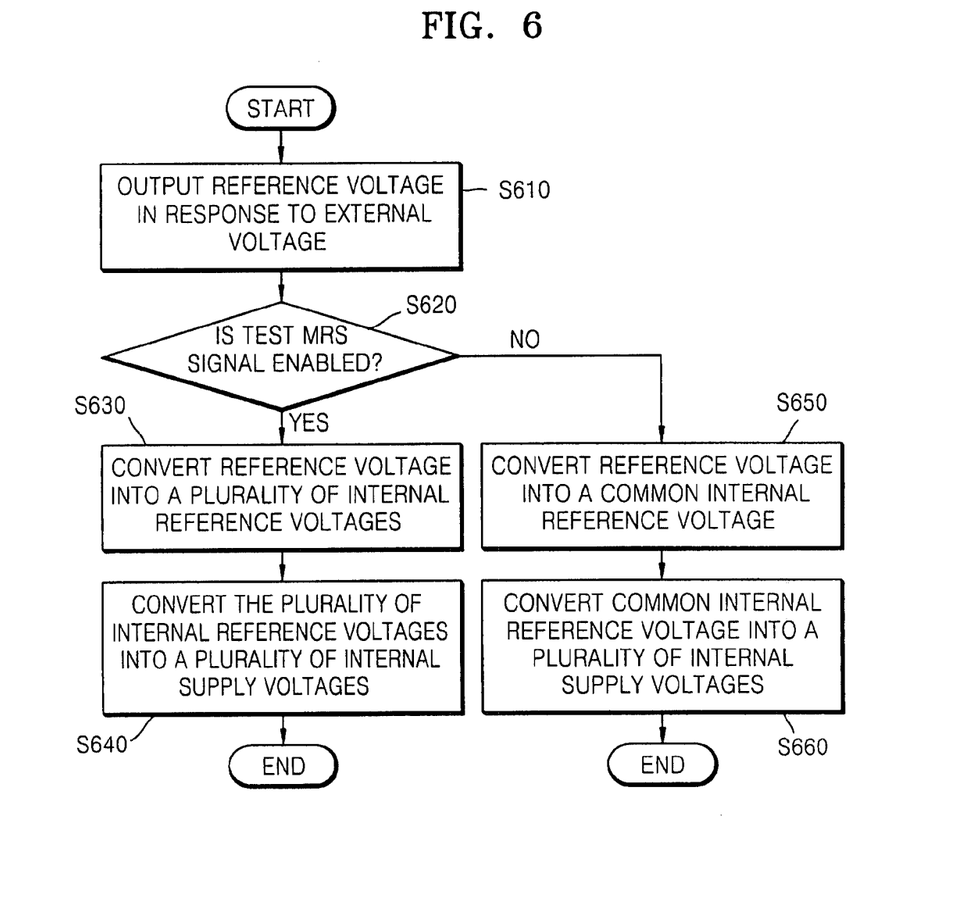
FIG. 6 is a flowchart of another embodiment of an internal supply voltage generating method according to another aspect of the present invention.

FIG. 6 is a flowchart of an embodiment of an internal supply voltage generating method according to another aspect of the present invention.

Referring to FIGS. 5 and 6, the reference voltage generating unit 510 outputs a reference voltage VREF in response to an external voltage VEXT (operation S610). It is decided whether a test MRS signal input to the internal reference voltage generating unit 520 is to be enabled (operation S620). If the test MRS signal is enabled, the internal reference voltage generating unit 520 converts a reference voltage VREF into first and second internal reference voltages VREFA_1 and VREFA_2, and outputs the first and second internal reference voltages VREFA_1 and VREFA_2 (operation S630). The internal supply voltage generating unit 540 converts the first and second internal reference voltages VREFA_1 and VREFA_2 into first and second internal supply voltages VINTA_1 and VINTA_2, and outputs the first and second internal supply voltages VINTA_1 and VINTA_2 (operation S640). If the test MRS signal is disabled, the internal reference voltage generating unit 520 converts the reference voltage VREF into a common internal reference voltage VREFA_1, and outputs the common internal reference voltage VREFA_1 (operation S650). The internal supply voltage generator 540 converts the common internal reference voltage VREFA_1 into first and second internal supply voltages VINTA_1 and VINTA_2, and outputs the first and second internal supply voltages VINTA_1 and VINTA_2 (operation S660).

As described above, in a semiconductor memory device for independently controlling internal supply voltages and a method of using the semiconductor memory device, according to aspects of the present invention, by independently controlling an internal boosting voltage and an array voltage that is to be applied to a memory cell array, it is possible to easily perform a voltage test operation and improve reliability related to internal boosting voltages.

While the present invention has been particularly shown and described with reference to exemplary embodiments thereof, it will be understood by those of ordinary skill in the art that various changes in form and details can be made therein without departing from the spirit and scope of the present invention as defined by the following claims. It is intended by the following claims to claim that which is literally described and all equivalents thereto, including all modifications and variations that fall within the scope of each claim.

What is claimed is:

1. A semiconductor memory device including a memory cell array, the semiconductor memory device comprising:
a reference voltage generating unit configured to output a reference voltage in response to an external voltage;
an internal reference voltage generating unit configured to convert the reference voltage into a plurality of internal reference voltages, and to output the plurality of internal reference voltages, wherein a level of each of the plurality of internal reference voltages is separately dependent on a test Mode Register Set (TEST_MRS) signal; and
an internal supply voltage generating unit configured to convert the plurality of internal reference voltages into a plurality of internal supply voltages, and to output the plurality of internal supply voltages,
wherein a first internal reference voltage of the plurality of internal reference voltages is used to generate a first internal supply voltage of the plurality of internal supply voltages, and a second internal reference voltage of the plurality of internal reference voltages is used to generate a second internal supply voltage of the plurality of internal supply voltages.

2. The semiconductor memory device of claim 1, wherein the internal reference voltage generating unit comprises:
a first internal reference voltage generator configured to convert the reference voltage into the first internal reference voltage, and to output the first internal reference voltage; and
a second internal reference voltage generator configured to convert the reference voltage into the second internal reference voltage, and to output the second internal reference voltage,
wherein the internal reference voltage generating unit is configured to independently vary the first internal reference voltage and the second internal reference voltage based on the reference voltage.

3. The semiconductor memory device of claim 2, wherein each of the first internal reference voltage generator and the second internal reference voltage generator comprises:
a comparison voltage generating circuit configured to generate and to output a comparison voltage using a corresponding internal reference voltage;
a comparison circuit configured to compare the comparison voltage with the reference voltage and to output the result of the comparison as an output signal; and
an internal reference voltage control circuit configured to control the corresponding internal reference voltage in response to the output signal of the comparison circuit.

4. The semiconductor memory device of claim 3, wherein the comparison voltage generating circuit comprises:
a plurality of resistors configured to divide the corresponding internal reference voltage; and
at least one fuse configured to cause at least one resistor of the plurality of resistors to be connected or disconnected.

5. The semiconductor memory device of claim 4, wherein the at least one fuse is cut-off or not cut-off in response to the test Mode Register Set (MRS)signal.

6. The semiconductor memory device of claim 3, wherein the comparison voltage generating circuit comprises:
a plurality of resistors configured to divide the corresponding internal reference voltage; and
at least one transistor configured to cause at least one resistor of the plurality of resistors to be connected or disconnected.

7. The semiconductor memory device of claim 6, wherein the transistor is turned on or off in response to the test Mode Register Set (MRS) signal.

8. The semiconductor memory device of claim 3, wherein the internal reference voltage control circuit is a transistor having a gate connected to an output terminal of the comparison circuit, a first terminal connected to the external voltage, and a second terminal connected to an output terminal of the internal reference voltage generator and the comparison voltage generating circuit.

9. The semiconductor memory device of claim 3, wherein the comparison circuit is a comparator configured to compare the reference voltage with the comparison voltage, and to output the result of the comparison.

10. The semiconductor memory device of claim 1, wherein the internal supply voltage generating unit comprises:
a first internal supply voltage generator configured to convert the first internal reference voltage into the first internal supply voltage, and to output the first internal supply voltage; and
a second internal supply voltage generator configured to convert the second internal reference voltage into the second internal supply voltage, and to output the second internal supply voltage.

11. The semiconductor memory device of claim 10, wherein each of the first internal supply voltage generator and the second internal supply voltage generator comprises:
a comparison circuit configured to compare the internal reference voltage with a corresponding internal supply voltage, and to output the result of the comparison as an output signal; and
an internal supply voltage control circuit configured to control the corresponding internal supply voltage according to the output signal of the comparison circuit.

12. The semiconductor memory device of claim 11, wherein the internal supply voltage control circuit is a transistor having a gate connected to an output terminal of the comparison circuit, a first terminal connected to the external voltage, and a second terminal connected to an output terminal of the internal supply voltage generator and an input terminal of the comparison circuit.

13. The semiconductor memory device of claim 11, wherein the comparison circuit is a comparator configured to compare the internal reference voltage with the comparison voltage, and to output the result of the comparison.

14. The semiconductor memory device of claim 1, wherein the reference voltage generating unit comprises a plurality of resistors configured to divide the external voltage and to generate the reference voltage.

15. The semiconductor memory device of claim 1, further comprising an internal boosting voltage generating unit configured to convert the second internal supply voltage into an internal boosting voltage, and to output the internal boosting voltage.

16. The semiconductor memory device of claim 1, wherein the first internal supply voltage is an array voltage which is supplied to the memory cell array.

17. An internal supply voltage generating method comprising:
outputting a reference voltage in response to an external voltage;
converting the reference voltage into a plurality of internal reference voltages, and outputting the plurality of internal reference voltages, wherein a level of each of the plurality of internal reference voltages is separately dependent on a test Mode Register Set (TEST_MRS) signal; and converting the plurality of internal reference voltages into a plurality of internal supply voltages, and outputting the plurality of internal supply voltages, wherein a first internal reference voltage of the plurality of internal reference voltages is used to generate a first internal supply voltage of the plurality of internal supply voltages, and a second internal reference voltage of the plurality of internal supply voltages is used to generate a second internal supply voltage of the plurality of internal supply voltages.

18. The method of claim 17, wherein the generating of the plurality of internal reference voltages comprises:

generating and outputting a comparison voltage using a corresponding internal reference voltage;

comparing the reference voltage with the comparison voltage; and controlling and outputting the corresponding internal reference voltage in response to the result of the comparison.

19. The method of claim 18, wherein the generating and outputting of the comparison voltage comprises dividing the corresponding internal reference voltage using a plurality of resistors, and outputting the result of the dividing as the comparison voltage.

20. The method of claim 19, wherein the generating and outputting of the comparison voltage further comprises changing the resistance of at least one resistor of the plurality of resistors by cutting-off or not cutting-off at least one fuse causing at least one resistor of the plurality of resistors to be connected or disconnected.

21. The method of claim 19, wherein the generating and outputting of the comparison voltage further comprises changing the resistance of the at least one resistor of the plurality of resistors by turning on or off at least one transistor causing at least one resistor of the plurality of resistors to be connected or disconnected.

22. The method of claim 17, wherein the outputting of the plurality of internal supply voltages comprises:

comparing the internal reference voltage with a corresponding internal supply voltage; and controlling and outputting the corresponding internal supply voltage in response to the result of the comparison.

23. The method of claim 17, wherein the outputting of the reference voltage comprises dividing the external voltage using the plurality of resistors, and outputting the result of the dividing as the reference voltage.

24. The method of claim 17, further comprising converting the second internal supply voltage of the plurality of internal supply voltages into an internal boosting voltage.

25. The method of claim 17, further comprising supplying the first internal supply voltage of the plurality of internal supply voltages to a memory cell array.

26. A semiconductor memory device including a memory cell array, the semiconductor memory device comprising:

a reference voltage generating unit configured to output a reference voltage in response to an external voltage;

an internal reference voltage generating unit configured to convert the reference voltage into at least one internal reference voltage, and to output the at least one internal reference voltage; and an internal supply voltage generating unit configured to convert the internal reference voltage into a plurality of internal supply voltages, and to output the plurality of internal supply voltages, wherein the internal reference voltage generating unit is configured to generate a common internal reference voltage which is used to generate the plurality of internal supply voltages, or to generate a plurality of internal reference voltages which are used to generate the plurality of internal supply voltages, in response to a test Mode Register Set (MRS) signal.

27. The semiconductor memory device of claim 26, wherein, when the test MRS signal is disabled, the internal reference voltage generating unit is configured to generate the common internal reference voltage which is used to generate the plurality of internal supply voltages, and when the test MRS signal is enabled, the internal reference voltage generating unit is configured to generate the plurality of internal reference voltages which are used to generate the plurality of internal supply voltages.

28. The semiconductor memory device of claim 27, wherein the internal reference voltage generating unit comprises:

a first internal reference voltage generator configured to convert the reference voltage into a first internal reference voltage of the plurality of internal reference voltages, and to output the first internal reference voltage; and a second internal reference voltage generator configured to convert the reference voltage into a second internal reference voltage of the plurality of internal reference voltages, and to output the second internal reference voltage, wherein the first internal reference voltage generator and the second internal reference voltage generator are respectively configured to generate the first internal reference voltage and the second internal reference voltage, when the test MRS signal is enabled.

29. An internal supply voltage generating method comprising:

outputting a reference voltage in response to an external voltage;

converting the reference voltage into at least one internal reference voltage, and outputting the at least one internal reference voltage; and converting the internal reference voltage into a plurality of internal supply voltages, and outputting the plurality of internal supply voltages, wherein the outputting of the at least one internal reference voltage comprises generating a common internal reference voltage which is used to generate the plurality of internal supply voltages, or generating a plurality of internal reference voltages which are used to generate the plurality of internal supply voltages, in response to a test Mode Register Set (MRS) signal.

30. The method of claim 29, wherein the outputting of the at least one internal reference voltage comprises:

when the test MRS signal is disabled, generating the common internal reference voltage which is used to generate the plurality of internal supply voltages; and when the test MRS signal is enabled, generating the plurality of internal reference voltages which are used to generate the plurality of internal supply voltages.

* * * * *